(12) United States Patent
Om

(10) Patent No.: US 7,888,962 B1
(45) Date of Patent: Feb. 15, 2011

(54) IMPEDANCE MATCHING CIRCUIT

(75) Inventor: Hari Om, Santa Clara, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 181 days.

(21) Appl. No.: 10/886,228

(22) Filed: Jul. 7, 2004

(51) Int. Cl.
H03K 17/16 (2006.01)
H03K 19/003 (2006.01)
H03K 19/00 (2006.01)

(52) U.S. Cl. .............. 326/30; 326/83; 327/108
(58) Field of Classification Search .......... 326/83, 326/86, 87, 90, 91
See application file for complete search history.

(56) References Cited

U.S. PATENT DOCUMENTS

| | | | |
|---|---|---|---|
| 3,737,673 A | 6/1973 | Suzuki | |
| 3,878,483 A | 4/1975 | Richardson | |
| 3,942,160 A | 3/1976 | Yu | |
| 3,973,139 A | 8/1976 | Dingwall | |
| 4,042,838 A | 8/1977 | Street et al. | |
| 4,100,437 A | 7/1978 | Hoff, Jr. | |
| 4,185,321 A | 1/1980 | Iwahashi et al. | |
| 4,217,502 A | 8/1980 | Suzuki et al. | |
| 4,219,743 A | 8/1980 | Millns et al. | |
| 4,301,383 A | 11/1981 | Taylor | |
| 4,329,600 A | 5/1982 | Stewart | |
| 4,371,271 A | 2/1983 | Bellet | |
| 4,388,537 A | 6/1983 | Kanuma | |
| 4,433,393 A | 2/1984 | Oritani | |
| 4,464,590 A | 8/1984 | Rapp | |
| 4,473,762 A | 9/1984 | Iwahashi et al. | |
| 4,484,092 A | 11/1984 | Campbell, Jr. | |
| 4,484,149 A | 11/1984 | Holloway | |
| 4,503,343 A | 3/1985 | Ohuchi | |
| 4,514,704 A | 4/1985 | Curtis | |
| 4,516,225 A | 5/1985 | Frederick | |
| 4,540,898 A | 9/1985 | Pumo et al. | |
| 4,543,561 A | 9/1985 | Holloway | |
| 4,574,273 A | 3/1986 | Atsumi et al. | |
| 4,585,958 A | 4/1986 | Chung et al. | |
| 4,612,462 A | 9/1986 | Asano et al. | |
| 4,612,631 A | 9/1986 | Ochii | |
| 4,616,344 A | 10/1986 | Noguchi et al. | |
| 4,627,032 A | 12/1986 | Kolwicz et al. | |
| 4,627,085 A | 12/1986 | Yuen | |
| 4,636,983 A | 1/1987 | Young et al. | |
| 4,656,608 A | 4/1987 | Aoyama | |
| 4,678,943 A | 7/1987 | Uragami et al. | |

(Continued)

FOREIGN PATENT DOCUMENTS

EP 0045133 A1 3/1982

(Continued)

OTHER PUBLICATIONS

U.S. Appl. No. 10/773,816: "Variable Impedance Output Driver," Om et al., filed on Feb. 6, 2004; 28 pages.

(Continued)

*Primary Examiner*—Rexford N Barnie
*Assistant Examiner*—Dylan White

(57) ABSTRACT

An impedance matching circuit has a reference impedance. A comparator has a first input coupled to a terminal of the reference impedance and has an output. A pull-up counter is coupled to the output of the single comparator.

13 Claims, 5 Drawing Sheets

U.S. PATENT DOCUMENTS

| | | |
|---|---|---|
| 4,684,831 A | 8/1987 | Kruest |
| 4,723,108 A | 2/1988 | Murphy et al. |
| 4,725,746 A | 2/1988 | Segawa et al. |
| 4,736,125 A | 4/1988 | Yuen |
| 4,742,493 A | 5/1988 | Lewallen et al. |
| 4,751,404 A | 6/1988 | Yuen |
| 4,758,743 A | 7/1988 | Dehganpour et al. |
| 4,769,589 A | 9/1988 | Rosenthal |
| 4,785,427 A | 11/1988 | Young |
| 4,800,298 A | 1/1989 | Yu et al. |
| 4,807,191 A | 2/1989 | Flannagan |
| 4,835,420 A | 5/1989 | Rosky |
| 4,845,385 A | 7/1989 | Ruth, Jr. |
| 4,860,259 A | 8/1989 | Tobita |
| 4,864,162 A | 9/1989 | Maoz |
| 4,873,669 A | 10/1989 | Furutani et al. |
| 4,874,970 A | 10/1989 | Coy et al. |
| 4,875,003 A | 10/1989 | Burke |
| 4,876,216 A | 10/1989 | Tobias et al. |
| 4,877,978 A | 10/1989 | Platt |
| 4,918,664 A | 4/1990 | Platt |
| 4,926,065 A | 5/1990 | Coy et al. |
| 4,948,991 A | 8/1990 | Schucker et al. |
| 4,954,769 A | 9/1990 | Kalthoff |
| 4,959,564 A | 9/1990 | Steele |
| 4,970,414 A | 11/1990 | Ruth, Jr. |
| 4,972,101 A | 11/1990 | Partovi et al. |
| 4,991,141 A | 2/1991 | Tran |
| 5,023,841 A | 6/1991 | Akrout et al. |
| 5,027,013 A | 6/1991 | Coy et al. |
| 5,031,142 A | 7/1991 | Castro |
| 5,036,222 A | 7/1991 | Davis |
| 5,038,056 A | 8/1991 | Koide et al. |
| 5,045,717 A | 9/1991 | Moen, Jr. et al. |
| 5,045,722 A | 9/1991 | Yang et al. |
| 5,047,711 A | 9/1991 | Smith et al. |
| 5,051,625 A | 9/1991 | Ikeda et al. |
| 5,057,715 A | 10/1991 | Larsen et al. |
| 5,065,055 A | 11/1991 | Reed |
| 5,068,831 A | 11/1991 | Hoshi et al. |
| 5,073,726 A | 12/1991 | Kato et al. |
| 5,079,449 A | 1/1992 | Obata |
| 5,083,294 A | 1/1992 | Okajima |
| 5,088,065 A | 2/1992 | Hanamura et al. |
| 5,097,148 A | 3/1992 | Gabara |
| 5,132,936 A | 7/1992 | Keswick et al. |
| 5,140,190 A | 8/1992 | Yoo et al. |
| 5,146,118 A | 9/1992 | Nakamura et al. |
| 5,150,186 A | 9/1992 | Pinney et al. |
| 5,153,450 A | 10/1992 | Ruetz |
| 5,157,282 A | 10/1992 | Ong et al. |
| 5,162,672 A | 11/1992 | McMahan et al. |
| 5,166,555 A | 11/1992 | Kano |
| 5,179,299 A | 1/1993 | Tipon |
| 5,212,440 A | 5/1993 | Waller |
| 5,216,290 A | 6/1993 | Childers |
| 5,218,242 A | 6/1993 | Imazu et al. |
| 5,229,668 A | 7/1993 | Hughes, Jr. et al. |
| 5,233,559 A | 8/1993 | Brennan, Jr. |
| 5,239,211 A | 8/1993 | Jinbo |
| 5,241,221 A | 8/1993 | Fletcher et al. |
| 5,241,502 A | 8/1993 | Lee et al. |
| 5,245,273 A | 9/1993 | Greaves et al. |
| 5,252,909 A | 10/1993 | Aizaki |
| 5,267,205 A | 11/1993 | Hamada |
| 5,270,588 A | 12/1993 | Choi |
| 5,272,390 A | 12/1993 | Watson, Jr. et al. |
| 5,272,395 A | 12/1993 | Vincelette |
| 5,281,869 A | 1/1994 | Lundberg |
| 5,300,828 A | 4/1994 | McClure |
| 5,319,252 A | 6/1994 | Pierce et al. |
| 5,319,258 A | 6/1994 | Ruetz |
| 5,319,259 A | 6/1994 | Merrill |
| 5,345,112 A | 9/1994 | Nazarian et al. |
| 5,347,183 A | 9/1994 | Phelan |
| 5,362,997 A | 11/1994 | Bloker |
| 5,365,118 A | 11/1994 | Wilcox |
| 5,373,199 A | 12/1994 | Shichinohe et al. |
| 5,381,061 A | 1/1995 | Davis |
| 5,381,370 A | 1/1995 | Lacey et al. |
| 5,382,847 A | 1/1995 | Yasuda |
| 5,383,157 A | 1/1995 | Phelan |
| 5,399,920 A | 3/1995 | Van Tran |
| 5,424,629 A | 6/1995 | Fujiwara et al. |
| 5,444,397 A | 8/1995 | Wong et al. |
| 5,444,406 A | 8/1995 | Horne |
| 5,446,867 A | 8/1995 | Young et al. |
| 5,448,182 A | 9/1995 | Countryman et al. |
| 5,457,407 A | 10/1995 | Shu et al. |
| 5,467,464 A | 11/1995 | Oprescu et al. |
| 5,469,558 A | 11/1995 | Lieberman et al. |
| 5,489,858 A | 2/1996 | Pierce et al. |
| 5,512,854 A | 4/1996 | Park |
| 5,514,979 A | 5/1996 | Collins et al. |
| 5,514,994 A | 5/1996 | Sawada |
| 5,528,166 A | 6/1996 | Iikbahar |
| 5,559,447 A | 9/1996 | Rees |
| 5,561,792 A | 10/1996 | Ganapathy |
| 5,565,794 A | 10/1996 | Porter |
| 5,583,457 A | 12/1996 | Horiguchi et al. |
| 5,587,678 A | 12/1996 | Dijkmans |
| 5,606,275 A | 2/1997 | Farhang et al. |
| 5,656,571 A | 8/1997 | Miller et al. |
| 5,692,165 A | 11/1997 | Jeddeloh et al. |
| 5,717,343 A | 2/1998 | Kwong |
| 5,726,589 A | 3/1998 | Cahill et al. |
| 5,732,027 A | 3/1998 | Arcoleo et al. |
| 5,781,034 A | 7/1998 | Rees et al. |
| 5,828,262 A | 10/1998 | Rees |
| 5,874,838 A | 2/1999 | Rees |
| 5,877,647 A | 3/1999 | Vajapey et al. |
| 5,894,241 A | 4/1999 | Rees |
| 5,898,321 A | 4/1999 | Ilkbahar |
| 5,917,335 A | 6/1999 | Rees |
| 5,973,520 A * | 10/1999 | Maruyama .................. 327/108 |
| 6,064,244 A | 5/2000 | Wakayama et al. |
| 6,166,563 A | 12/2000 | Volk et al. |
| 6,225,819 B1 | 5/2001 | Rees et al. |
| 6,307,424 B1 | 10/2001 | Lee |
| 6,384,621 B1 * | 5/2002 | Gibbs et al. .................... 326/30 |
| 6,459,320 B2 * | 10/2002 | Lee ............................. 327/310 |
| 6,459,679 B1 * | 10/2002 | Kim ............................. 370/208 |
| 6,525,558 B2 * | 2/2003 | Kim et al. ....................... 326/30 |
| 6,541,996 B1 | 4/2003 | Rosefield et al. |
| 6,573,746 B2 | 6/2003 | Kim et al. |
| 6,690,211 B1 * | 2/2004 | Huang et al. ................. 327/108 |
| 6,734,702 B1 | 5/2004 | Ikeoku et al. |
| 6,762,620 B2 | 7/2004 | Jang et al. |
| 6,815,979 B2 | 11/2004 | Ooshita |
| 6,828,820 B2 * | 12/2004 | Ohno ............................. 326/30 |
| 6,836,143 B2 * | 12/2004 | Song ............................. 326/30 |
| 7,038,486 B2 | 5/2006 | Aoyama et al. |
| 7,084,662 B1 | 8/2006 | Om et al. |
| 7,167,020 B2 | 1/2007 | Allan |
| 7,332,904 B1 | 2/2008 | Menkus et al. |
| 7,479,800 B1 | 1/2009 | Vullaganti |

FOREIGN PATENT DOCUMENTS

| | | | |
|---|---|---|---|
| EP | 0046498 | A1 | 3/1982 |
| EP | 0129661 | A1 | 2/1985 |
| EP | 0315473 | A2 | 5/1989 |
| EP | 317271 | A2 | 5/1989 |
| EP | 443435 | B1 | 10/1995 |

| | | | |
|---|---|---|---|
| JP | 52-35570 | A1 | 3/1977 |
| JP | 53-125753 | A1 | 11/1978 |
| JP | 59-16424 | A1 | 1/1984 |

OTHER PUBLICATIONS

USPTO Notice of Allowance for U.S. Appl. No. 10/773,816 dated Mar. 21, 2006; 6 pages.
USPTO Non-Final Rejection for U.S. Appl. No. 10/773,816 dated Nov. 30, 2005; 7 pages.
USPTO Non-Final Rejection for U.S. Appl. No. 10/773,816 dated Jul. 26, 2005; 7 pages.
U.S. Appl. No. 11/138,823: "Impedance Buffer and Method," Derek Yang, filed on May 26, 2005; 23 pages.
USPTO Non-Final Rejection for U.S. Appl. No. 11/138,823 dated Dec. 4, 2008; 7 pages.
USPTO Final Rejection for U.S. Appl. No. 11/138,823 dated Jun. 25, 2008; 9 pages.
USPTO Non-Final Rejection for U.S. Appl. No. 11/138,823 dated Dec. 21, 2007; 7 pages.
USPTO Final Rejection for U.S. Appl. No. 11/138,823 dated Sep. 25, 2007; 8 pages.
USPTO Non-Final Rejection for U.S. Appl. No. 11/138,823 dated Jun. 4, 2007; 6 pages.
USPTO Non-Final Rejection for U.S. Appl. No. 11/138,823 dated Jan. 18, 2007; 17 pages.
USPTO Notice of Allowance for U.S. Appl. No. 08/837,782 dated Jan. 20, 1999; 3 pages.
USPTO Non-Final Rejection for U.S. Appl. No. 08/837,782 dated Nov. 16, 1998; 5 pages.
USPTO Notice of Allowance for U.S. Appl. No. 09/790,372 dated Dec. 10, 2001; 4 pages.
USPTO Notice of Allowance for U.S. Appl. No. 09/040,033 dated Dec. 15, 2000; 1 page.
USPTO Final Rejection for U.S. Appl. No. 09/040,033 dated Oct. 3, 2000; 7 pages.
USPTO Non-Final Rejection for U.S. Appl. No. 09/040,033 dated May 9, 2000; 6 pages.
USPTO Final Rejection for U.S. Appl. No. 09/040,033 dated Dec. 23, 1999; 9 pages.
USPTO Non-Final Rejection for U.S. Appl. No. 09/040,033 dated Aug. 17, 1999; 8 pages.
Sonoda, "MOSFET Powering Circuit," IBM Technical Disclosure Bulletin, vol. 13, No. 9; 1971, pp. 2658; 1 page.
Harroun, "Bootstrap inverter Driver," IBM Technical Disclosure Bulletin, vol. 19, No, 3; 1976, pp. 827-828; 2 pages.
"Bufferized ECL-Type Logic Circuit," IBM Technical Disclosure Bulletin, vol. 33, No, 4; 1990, pp. 343-344; 2 pages.
Lewis et al., "Bootstrapped FET Driver," IBM Technical Disclosure Bulletin, vol. 18, No. 11; 1976; 2 pages.
"9-Mb Pipelined SRAM with QDR Architecture," CY7C1302V25, Mar. 28, 2000, pp. 1-21; 21 pages.
Gabara et al., "Digitally Adjustable Resistors in CMOS for High-Performance Applications," IEEE Journal of Solid-State Circuits, vol. 2, No. 8, Aug. 1992, pp. 1176-1185; 10 pages.
Kalter et al., "Field-Effect Transistor Driver Circuit," IBM Technical Disclosure Bulletin, vol. 18, No. 4, Sep. 1975, pp. 1028-1029; 2 pages.
USPTO Non-Final Rejection for U.S. Appl. No. 08/341,371 dated May 17, 1995; 2 pages.
USPTO Notice of Allowance for U.S. Appl. No. 08/664,061 dated Mar. 6, 1998; 1 page.
USPTO Non-Final Rejection for U.S. Appl. No. 08/664,061 dated Sep. 8, 1997; 4 pages.
USPTO Notice of Allowance for U.S. Appl. No. 08/680,288 dated Feb. 4, 1998; 3 pages.
USPTO Non-Final Rejection for U.S. Appl. No. 08/680,288 dated Jul. 14, 1997; 6 pages.
USPTO Notice of Allowance for U.S. Appl. No. 08/723,077 dated May 22, 1999; 2 pages.
USPTO Non-Final Rejection for U.S. Appl. No. 08/723,077 dated Jan. 16, 1998; 5 pages.
USPTO Requirement for Restriction for U.S. Appl. No. 08/723,077 dated Oct. 10, 1997; 3 pages.
USPTO Notice of Allowance for U.S. Appl. No. 08/723,076 dated Oct. 8, 1998; 6 pages.
USPTO Advisory Action for U.S. Appl. No. 08/723,076 dated Aug. 19, 1998; 2 pages.
USPTO Final Rejection for U.S. Appl. No. 08/723,076 dated Apr. 1, 1998; 6 pages.
USPTO Non-Final Rejection for U.S. Appl. No. 08/723,076 dated Sep. 24, 1997; 8 pages.
USPTO Requirement for Restriction for U.S. Appl. No. 08/723,076 dated Jul. 2, 1997; 5 pages.
USPTO Notice of Allowance for U.S. Appl. No. 08/341,371 dated Feb. 13, 1996; 2 pages.
USPTO Final Rejection for U.S. Appl. No. 11/540,831 dated Jun. 2, 2008; 8 pages.
USPTO Non-Final Rejection for U.S. Appl. No. 11/540,831 dated Nov. 29, 2007; 8 pages.
USPTO Notice of Allowance for U.S. Appl. No. 11/540,831 dated Sep. 12, 2008; 4 pages.
USPTO Notice of Allowance for U.S. Appl. No. 11/540,996 dated Jul. 13, 2009; 6 pages.
USPTO Notice of Allowance for U.S. Appl. No. 11/540,996 dated Jan. 9, 2009; 6 pages.
USPTO Non-Final Rejection for U.S. Appl. No. 11/540,996 dated Aug. 28, 2008; 6 pages.
USPTO Non-Final Rejection for U.S. Appl. No. 11/540,996 dated Feb. 5, 2008; 13 pages.
USPTO Non-Final Rejection for U.S. Appl. No. 11/540,996 dated Oct. 22, 2009; 5 pages.
Weste et al., "CMOS VLSI Design: A System Perspective," Transmission Gate, Addison-Wesley, 1998, pp. 55-56; 2 pages.
USPTO Notice of Allowance for U.S. Appl. No. 11/540,996 dated Mar. 22, 2010; 7 pages.
USPTO Notice of Allowance for U.S. Appl. No. 06/886,835 dated Aug. 14, 1987; 1 page.
USPTO Ex Parte Quayle Action for U.S. Appl. No. 06/886,835 dated May 20, 1987; 2 pages.
USPTO Non-Final Rejection for U.S. Appl. No. 06/886,835 dated Jan. 2, 1987; 3 pages.
USPTO Notice of Allowance for U.S. Appl. No. 07/991,568 dated May 20, 1994; 1 page.
USPTO Final Rejection for U.S. Appl. No. 07/991,568 dated Feb. 1, 1994; 5 pages.
USPTO Non-Final Rejection for U.S. Appl. No. 07/991,568 dated Oct. 5, 1993; 5 pages.
USPTO Notice of Allowance for U.S. Appl. No. 07/246,634 dated Aug. 14, 1989; 1 page.
USPTO Non-Final Rejection for U.S. Appl. No. 07/246,634 dated Jun. 19, 1989; 3 pages.
Cypress Semiconductor, "Cypress Data Book Memories DataCom FCT Logic PC Products," May 1995, pp. i-vii, 2-36 through 2-43, 2-227, 2-258 through 2-268, 6-1 through 6-15, and 6-74 though 6-84; 54 pages.
USPTO Notice of Allowance for U.S. Appl. No. 08/576,081 dated Jan. 31, 2000; 1 page.
USPTO Non-Final Rejection for U.S. Appl No. 08/576,081 dated Sep. 14, 1999; 7 pages.
USPTO Final Rejection for U.S. Appl. No. 08/576,081 dated Apr. 12, 1999; 13 pages.
USPTO Non-Final Rejection for U.S. Appl. No. 08/576,081 dated Oct. 19, 1998; 9 pages.
USPTO Final Rejection for U.S. Appl. No. 08/576,081 dated Apr. 22, 1998; 7 pages.
USPTO Non-Final Rejection for U.S. Appl. No. 08/576,081 dated Oct. 1, 1997; 6 pages.
USPTO Notice of Allowance for U.S. Appl. No. 08/228,927 (MCT0001C) dated Apr. 21, 1995; 2 pages.
USPTO Non-Final Rejection for U.S. Appl. No. 08/228,927 (MCT0001C) dated Jul. 19, 1994; 4 pages.
USPTO Notice of Allowance for U.S. Appl. No. 09/006,772 dated Sep. 28, 1998; 2 pages.

USPTO Non-Final Rejection for U.S. Appl. No. 09/006,772 dated May 18, 1998; 7 pages.
USPTO Notice of Allowance for U.S. Appl. No. 08/777,488 dated May 27, 1997; 1 page.
USPTO Non-Final Rejection for U.S. Appl. No. 08/777,488 dated Apr. 14, 1997; 3 pages.
Griffin et al., Memory 1996: Complete Coverage of DRAM, SRAM, EPROM, and Flash Memory ICs, Chapter 7, "DRAM Technology," pp. 7-1 through 7-20, Integrated Circuit Engineering Corporation, 1996; 22 pages.
Griffin et al., Memory 1996: Complete Coverage of DRAM, SRAM, EPROM, and Flash Memory ICs, Chapter 8, "SRAM Technology," pp. 8-1 though 8-18, Integrated Circuit Engineering Corporation, 1996; 20 pages.
Cypress Semiconductor, "Programmable Skew Clock Buffer (PSCB)," 1995, pp. 10-130 through 10-139; 13 pages.
USPTO Notice of Allowance for U.S. Appl. No. 07/007,957 dated Jul. 5, 1988; 3 pages.
USPTO Non-Final Rejection for U.S. Appl. No. 07/007,957 dated Nov. 30, 1987; 3 pages.
USPTO Notice of Allowance for U.S. Appl. No. 07/298,472 dated Jan. 3, 1990; 1 page.
USPTO Non-Final Rejection for U.S. Appl. No. 07/298,472 dated Oct. 17, 1989; 2 pages.
USPTO Notice of Allowance for U.S. Appl. No. 07/675,021 dated Nov. 5, 1991; 2 pages.
USPTO Non-Final Rejection for U.S. Appl. No. 07/675,021 dated Jul. 2, 1991; 5 pages.
USPTO Notice of Allowance for U.S. Appl. No. 07/682,571 dated Jun. 15, 1992; 1 page.
USPTO Final Rejection for U.S. Appl. No. 07/682,571 dated Mar. 26, 1992; 4 pages.
USPTO Non-Final Rejection for U.S. Appl. No. 07/682,571 dated Dec. 2, 1991; 4 pages.
USPTO Non-Final Rejection for U.S. Appl. No. 07/956,794 dated Sep. 7, 1993; 3 pages.
USPTO Notice of Allowance for U.S. Appl. No. 08/103,449 dated Jul. 26, 1994; 1 page.
USPTO Non-Final Rejection for U.S. Appl. No. 08/103,449 dated Mar. 10, 1994; 4 pages.
USPTO Notice of Allowance for U.S. Appl. No. 08/111,164 dated Jul. 12, 1994; 3 pages.
USPTO Non-Final Rejection for U.S. Appl. No. 08/111,164 dated Mar. 23, 1994; 3 pages.
Fitzgerald et al., "Memory System with High-Performance Word Redundancy," IBM Technical Disclosure Bulletin, vol. 19, No. 5, pp. 1638-1639, Oct. 1976; 2 pages.
Sweha et al., "A 29ns 8Mb EPROM with Dual Reference-Column ATD Sensing," IEEE International Solid-State Circuits Conference Digest of Technical Papers, pp. 264-265, Feb. 1991; 3 pages.
USPTO Notice of Allowance for U.S. Appl. No. 07/945,705 dated Mar. 21, 1994; 1 page.
USPTO Non-Final Rejection for U.S. Appl. No. 07/945,705 dated Oct. 15, 1993; 9 pages.
Mano, "Computer Engineering: Hardware Design," Prentice Hall, 1988, pp. 96-99; 4 pages.
USPTO Notice of Allowance for U.S. Appl. No. 07/956,794 dated Mar. 17, 1994; 1 page.
USPTO Notice of Allowance for U.S. Appl. No. 07/945,705 dated Mar. 30, 1994; 1 page.

* cited by examiner

IMPEDANCE MATCHING CIRCUIT

RELATED APPLICATIONS

None

FIELD OF THE INVENTION

The present invention relates generally to the field of electronic circuits and more particularly an impedance matching circuit.

BACKGROUND OF THE INVENTION

Impedance mismatch between transmission lines and driver/receiver impedances can cause signal reflections and may degrade the signal. One solution to this problem has been a programmable impedance matching circuit on the transmitter and receiver. This input impedance matching circuit can be on-board or on-chip. On-board circuits take up a lot of board space. One embodiment of this invention utilizes an on-chip impedance matching circuit. A calibration resistor is used to define the pull-up and pull-down arrays impedances. The pull-up array is placed in series with the calibration impedance and a supply voltage is applied across the pull-up array and the calibration impedance. The voltage at the node between the pull-up array and the calibration impedance is compared to a reference voltage in a comparator. The impedance of the pull-up array is adjusted until the voltage at the node is equal to the reference voltage. Usually, the reference voltage is one half the supply voltage. As a result, the impedance of the pull-up array is equal to the calibration impedance. A second comparator is used to set the impedance of the pull-down array either by placing another pull-up array and pull-down array in series or another reference impedance in series with the pull-down array. Unfortunately, in these cases the offset of the comparators can add and result in two comparator offsets in the calibration impedance of the pull-down array. Also, it can introduce two comparator offsets between the impedance of the pull-up array and the pull-down array. In a single ended system, when data is transmitted between a transmitter and a receiver the data common mode depends on the value of the pull-up and pull-down impedance on the transmitter and the receiver. Also the data is sensed by comparing it with an ideal common mode [usually a reference voltage] in the receiver. Any mismatch between the data common mode and the ideal common mode causes clock-to-data skew. This skew may be significant in high speed signaling system. The skew may occur because a negative going data pulse is clocked by a positive going clock pulse. One signal is controlled by pull-up array's impedance while the other signal is controlled by the pull-down array's impedance.

Thus there exists a need for an impedance matching circuit that improves accuracy and reduces the difference in the impedance between the pull-up array and the pull-down array.

SUMMARY OF INVENTION

An impedance matching circuit that overcomes these and other problems has a reference impedance. A single comparator has a first input coupled to a terminal of the reference impedance and has an output. A pull-up counter/register is coupled to the output of the single comparator. A pull-up array may have a first terminal coupled to a power supply voltage and may have a second terminal coupled to the terminal of the reference impedance and the first input of the comparator. A second input of the comparator may be coupled to a reference voltage. A pull-down array may have a first terminal coupled to a ground. A second terminal may be coupled to the first input of the single comparator. A switch may be between the terminal of the reference impedance and the first input of the single comparator. Another switch may be between the second terminal of the pull-down array and the first input of the single comparator. A switch is coupled between the pull-up counter and the output of the single comparator.

In one embodiment, an impedance matching circuit has a reference impedance with a first terminal coupled to a ground. A single comparator has a first input coupled to a second terminal of the reference impedance and a second input coupled to a reference voltage. A counter/register may be coupled to an output of the single comparator. An impedance matching array may have a control input coupled to an output of the counter/register. The counter/register may include a pull-up counter/register and a pull-down counter/register. The impedance matching array may include a pull-up array and a pull-down array. A control circuit may select either the pull-up array or the pull-down array.

In one embodiment, an impedance matching input buffer has an impedance matching circuit with a reference impedance and a single comparator. A pull-up array is coupled to a pull-down array and an input signal. the pull-up array receiving an impedance matching signal from the impedance matching circuit; An input buffer has an input coupled to the pull-up array, the pull-down array and the input signal The impedance matching circuit may have a pull-up array in series with the reference impedance and a switching network coupling the single comparator to a node between the pull-up array and the reference impedance. The impedance matching circuit may have a pull-up counter/register coupled to the output of the comparator and a pull-down counter/register may be coupled to the output of the comparator. The impedance matching array may include a pull-up array and a pull-down array. The pull-up array of the impedance matching circuit has an impedance that is a predetermined ratio of an impedance of the pull-up array coupled to the input buffer. The impedance matching circuit has a first reference impedance and a second reference impedance. An accuracy of an input impedance of the impedance matching input buffer is within one comparator offset and an impedance mismatch between the pull-up array and the pull-down array is independent of comparator offset.

DETAILED DESCRIPTION OF THE DRAWINGS

Figure 1:
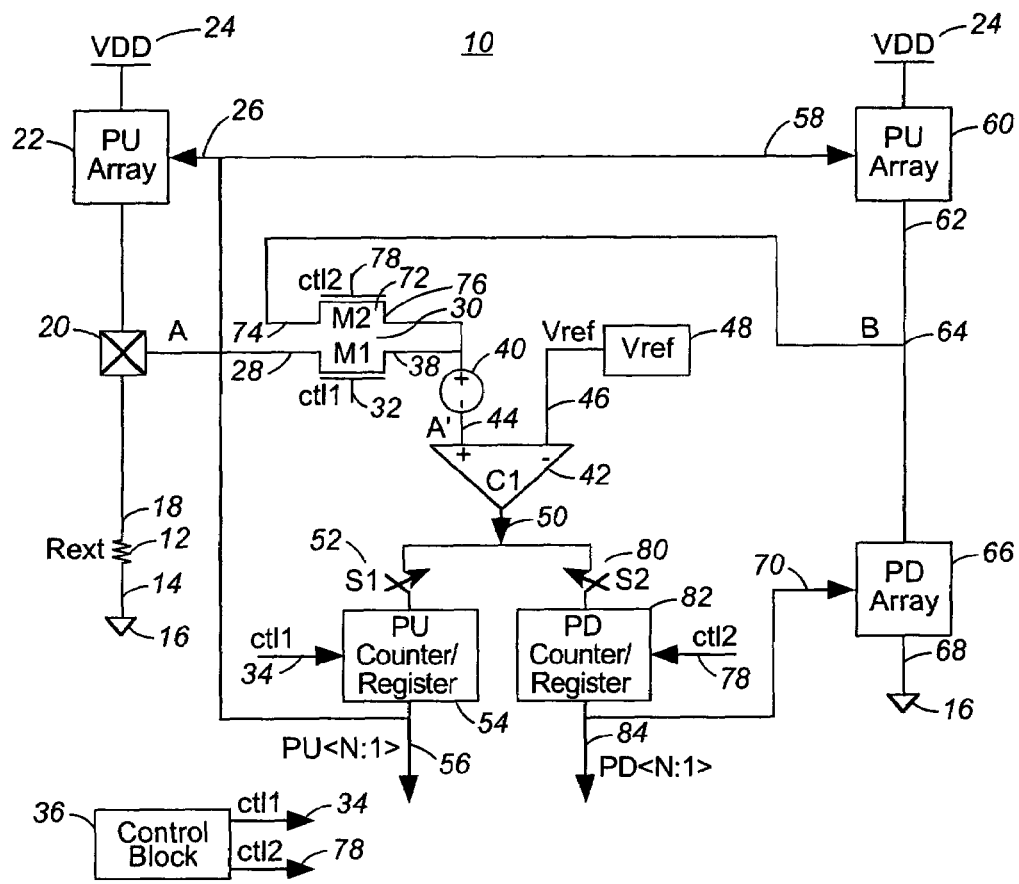
FIG. 1 is a block diagram of an impedance matching circuit in accordance with one embodiment of the invention.

The impedance matching circuit described herein reduces the impedance mismatch between the pull-up array and the pull-down array and improves accuracy. FIG. 1 is a block diagram of an impedance matching circuit 10 in accordance with one embodiment of the invention. The circuit 10 has a reference or calibration impedance 12 that may be a resistor. This resistor 12 has a first terminal 14 coupled to a ground 16 and a second terminal 18 electrically coupled to a pad 20 or node A. Node A 20 is coupled to a pull-up (PU) array 22 and the pull-up array 22 is coupled to a power supply voltage (VDD) 24. The pull-up array 24 has a control input 26.

Node A 20 is also coupled to a drain 28 of transistor or switch 30 labeled M1. The gate 32 of the transistor 30 is coupled to a control 1 signal (ctl1) 34. The control 1 signal 34 is generated by a control block 36 shown in the lower left part of the diagram. The source 38 of the transistor 30 is coupled to a comparator represented schematically as an offset voltage source 40 and an ideal comparator 42. As a result, node A 20 is connected to the positive input 44 of the comparator 42 when the switch 30 is closed. The negative input 46 of the comparator 42 is coupled to a reference voltage (Vref) 48. The output 50 of the comparator 42 is coupled through a switch (S1) 52 to a pull-up counter/register 54. The counter/register 54 has a control input 34 and a pull-up output 56. The output 56 is coupled to the control input 26 of the pull-up array 22 and the control input 58 of a second pull-up array 60.

The second pull-up array 60 has a first terminal coupled to the supply voltage 24 and a second terminal 62 coupled through node B 64 to a pull-down (PD) array 66. The pull-down array 66 has a second terminal 68 coupled to ground 16. The pull-down array 66 has a control input 70. The node B 64 is coupled through a switch (M2) 72 to the positive input 44 of the comparator 42. The switch 72 is a transistor with its drain 74 coupled to node B 64 and its source 76 coupled to the comparator 42. The gate 78 is coupled to a control 2 (ctl2) signal generated by the control block 36.

The output 50 of the comparator 42 is coupled through a second switch (S2) 80 to a pull-down counter/register 82. The output 84 of the pull-down counter/register 82 is coupled to the control input 70 of the pull-down array 66.

There are two feedback loops in the impedance matching circuit 10. One loop includes the comparator 42, the first switch (S1) 52, the pull-up counter register 54 and the pull-up array 22. The other loop includes the comparator 42, the second switch 80, the pull-down counter register 82 and the pull-down array 66.

Initially, the pull-up array loop is enabled while the pull-down array loop is disabled. This means that switch (M1) 30 is closed, switch one 52 is closed, while switch (M2) 72 is open and switch two 80 is open. The output 50 of the comparator 42 is coupled to the pull-up counter/register 54. Every time the comparator 42 finds a difference in the voltage on its positive input 44 and its negative input 46, the pull-up counter/register 54 is incremented or decremented. This turns off or on fingers in the pull-up array 22 which changes the impedance of the pull-up array 22. The pull-up array 22 is described in more detail with respect to FIG. 3. This process continues until the impedance of the pull-up array 22 equals the impedance of the calibration impedance 12. The corresponding n-bit word is stored in the pull-up register 54.

Once the pull-up array bits are stored in the pull-up register 54, the pull-down loop is activated. This means that switch (M2) 72 is closed, switch two 80 is closed, while switch (M1) 30 is open and switch one 52 is open. The output 50 of the comparator 42 is coupled to the pull-down counter/register 82. Every time the comparator 42 finds a difference in the voltage on its positive input 44 and its negative input 46, the pull-down counter/register 82 is incremented or decremented. This turns on or off fingers in the pull-down array 66 which changes the impedance of the pull-down array 66. The pull-down array 66 is described in more detail with respect to FIG. 4. This process continues until the impedance of the pull-down array 66 equals the impedance of the second pull-up array 60. The corresponding n-bit word is stored in the pull-down register 82. Note that in one embodiment the reference voltage 48 is one half the supply voltage.

This information of how to set the pull-up array and pull-down array may now be used in with a output driver or an input buffer. Since a single comparator 42 is used in the circuit 10, the pull-up array and the pull-down array may differ only by a single comparator offset voltage rather than being off by as much as two comparator offset voltages. This reduces timing skew and other problems associated with impedance mismatches. Also the accuracy in the impedance of the pull-up array and pull-down array is improved by one comparator offset voltage.

Figure 2:
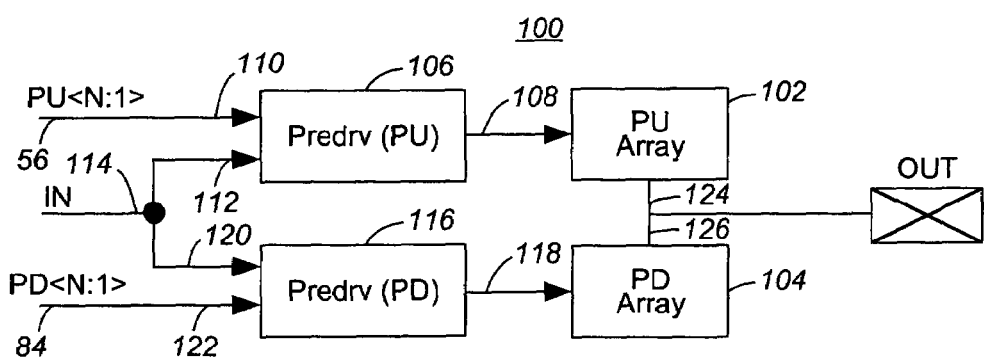
FIG. 2 is a block diagram of an output driver in accordance with one embodiment of the invention.

FIG. 2 is a block diagram of an output driver 100 in accordance with one embodiment of the invention. The driver circuit 100 has a pull-up array 102 and a pull-down array 104, which are replicas of the pull-up array 22 and the pull-down array 66 shown in FIG. 1. The circuit 100 has a pull-up predriver 106 with an output 108 coupled to the pull-up array 102. One input 110 to the pull-up predriver 106 is the n-bit word from the pull-up register 54 output 56. The other input 112 is the input signal 114. A pull-down predriver 116 has an output 118 coupled to the pull-down array 104. One input 122 to the pull-down predriver 116 is the n-bit word from the pull-down register 82 output 84. The other input 120 is the input signal 114. The output 124 of the pull-up array 102 is combined with the output 126 of the pull-down array 104.

Figure 3:
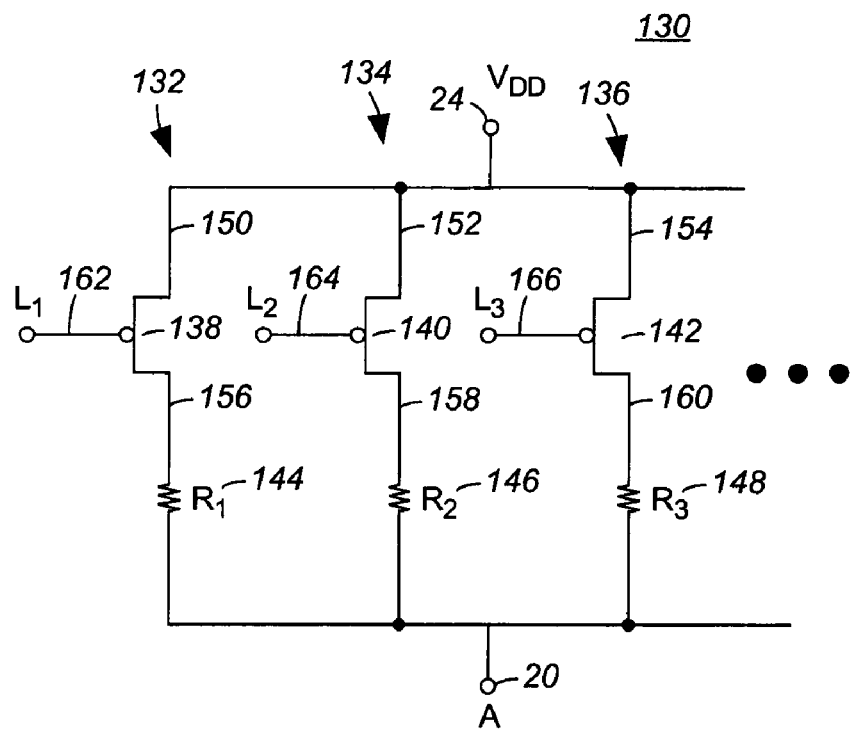
FIG. 3 is a circuit diagram of a pull-up array in accordance with one embodiment of the invention.

FIG. 3 is a circuit diagram of a pull-up array 130 in accordance with one embodiment of the invention. The pull-up array has a number of fingers 132, 134, 136 of which only three are shown. Each finger consists of a p-type transistor 138, 140, 142 in series with a resistor or impedance 144, 146, 148. The sources 150, 152, 154 are connected to the power supply voltage (VDD) 24. The drains 156, 158, 160 are coupled to the resistors 144, 146, 148 respectively. The other terminal of the resistors 144, 146, 148 is coupled to node A 20 (In FIG. 1 left side). Each of the legs 132, 134, 136 are activated by the pull-up register 54 placing a low voltage on the gates (L1, L2, L3) 162, 164, 166. As a result, if the signal L1 162 is low, transistor 138 is on and current flows through resistor 144. In this way the impedance of the pull-up array 130 is varied.

Figure 4:
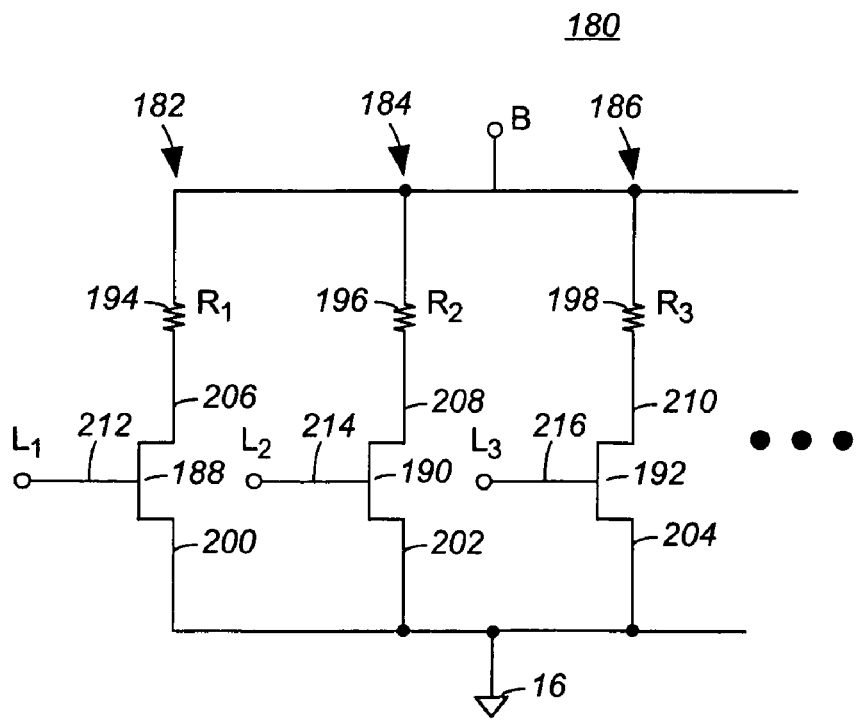
FIG. 4 is a circuit diagram of a pull-down array in accordance with one embodiment of the invention.

FIG. 4 is a circuit diagram of a pull-down array 180 in accordance with one embodiment of the invention. The pull-down array has a number of fingers 182, 184, 186 of which only three are shown. Each finger consists of an n-type transistor 188, 190, 192 in series with a resistor or impedance 194, 196, 198. The sources 200, 202, 204 are connected to the ground 16. The drains 206, 208, 210 are coupled to the resistors 194, 196, 198 respectively. The other terminal of the resistors 194, 196, 198 is coupled to node B 64 (In FIG. 1 right side). Each of the legs 182, 184, 186 are activated by the pull-down register 82 placing a high voltage on the gates (L1, L2, L3) 212, 214, 216. As a result, if the signal L1 212 is high, transistor 188 is on and current flows through resistor 194. In this way the impedance of the pull-down array 180 is varied.

Figure 5:
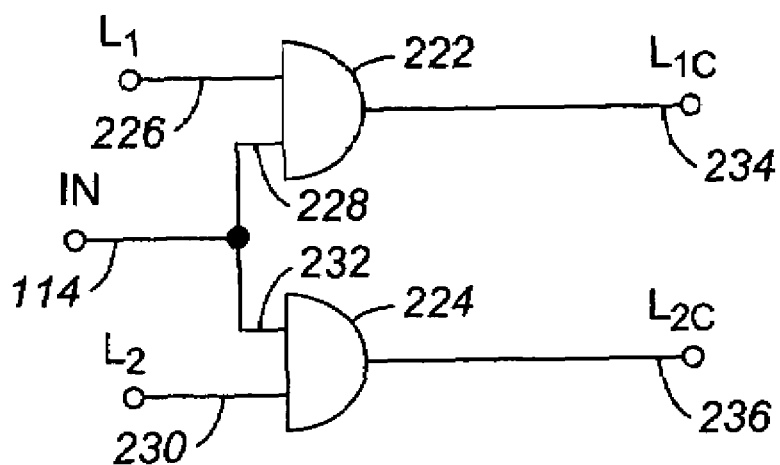
FIG. 5 is a circuit diagram of a pull-down predriver in accordance with one embodiment of the invention.

FIG. 5 is a circuit diagram of a pull-down predriver 220 in accordance with one embodiment of the invention. The pull-down predriver 220 is part of the output driver circuit 100 of FIG. 2. The predriver 220 has a number of AND gates 222, 224 of which only two are shown. AND gate 222 has a first input 226 coupled to the bit 1 or leg one output of the pull-down register 84. The other input 228 is coupled to the input signal 114. AND gate 224 has a first input 230 coupled to the bit 2 or leg two output of the pull-down register 84. The other input 232 is coupled to the input signal 114. The output 234 of AND gate 222 forms the input to a first leg of the pull-down array 104 of the driver circuit 100. The output 236 of AND gate 224 forms the input to a second leg of the pull-down array 104 of the driver circuit 100.

Figure 6:
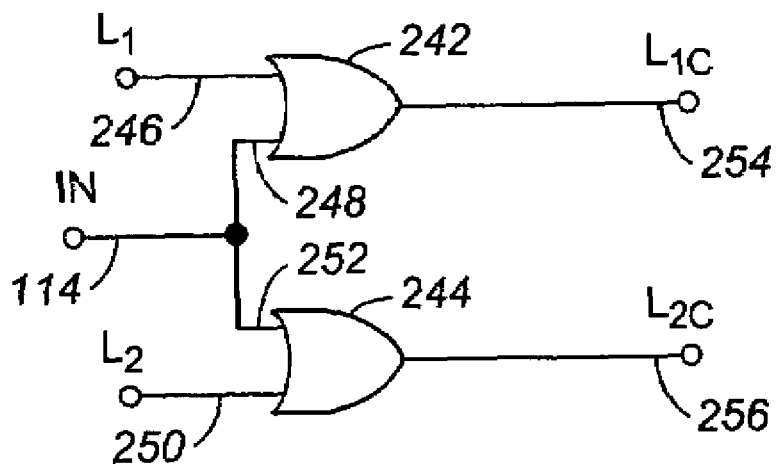
FIG. 6 is a circuit diagram of a pull-up predriver in accordance with one embodiment of the invention.

FIG. 6 is a circuit diagram of a pull-up predriver 240 in accordance with one embodiment of the invention. The pull-up predriver 240 is part of the output driver circuit 100 of FIG. 2. The predriver 240 has a number of OR gates 242, 244 of which only two are shown. OR gate 242 has a first input 246 coupled to the bit 1 or leg one output of the pull-up register 54. The other input 248 is coupled to the input signal 114. OR gate 244 has a first input 250 coupled to the bit 2 or leg two output of the pull-up register 54. The other input 252 is coupled to the input signal 114. The output 254 of OR gate 242 forms the input to a first leg of the pull-up array 102 of the driver circuit 100. The output 256 of OR gate 244 forms the input to a second leg of the pull-up array 102 of the driver circuit 100.

Figure 7:
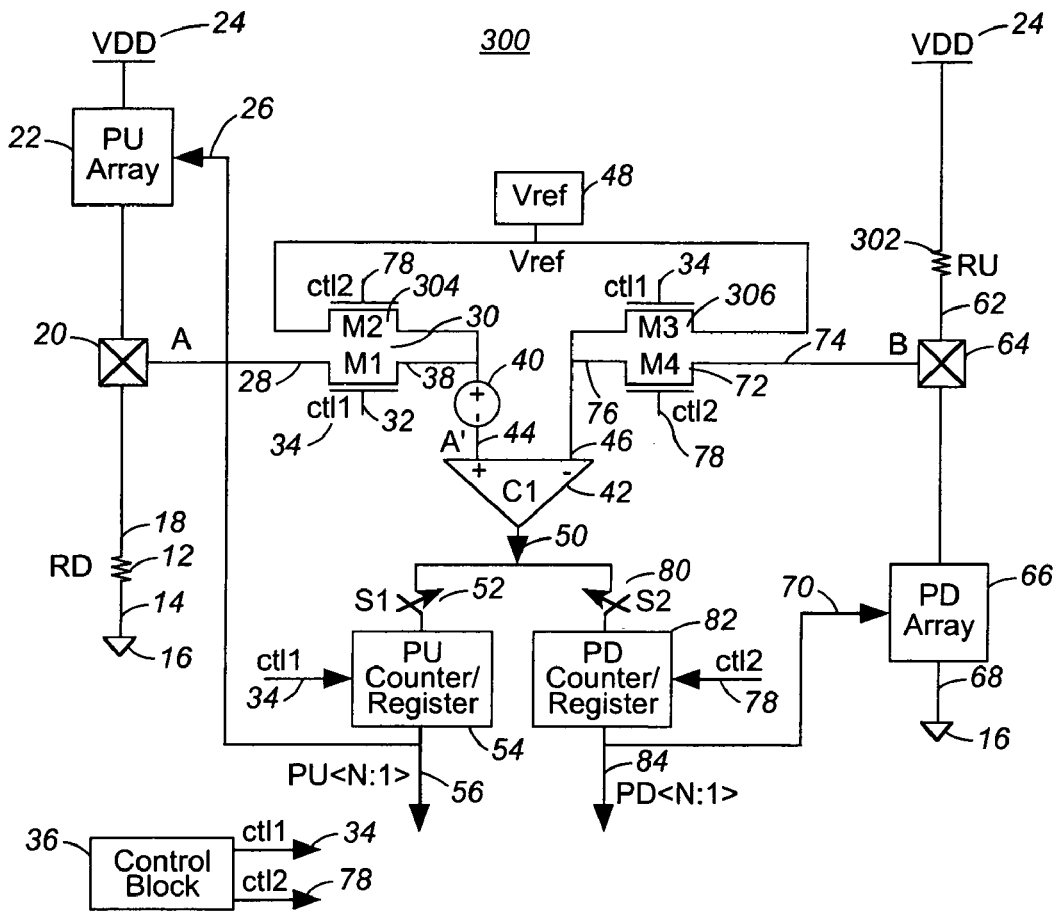
FIG. 7 is a block diagram of an impedance matching circuit in accordance with one embodiment of the invention.

FIG. 7 is a block diagram of an impedance matching circuit 300 in accordance with one embodiment of the invention. The circuit of FIG. 7 is very similar to the circuit shown in FIG. 1 and the same reference numerals will be used for similar elements. The circuit 300 has a reference or calibration impedance (RD) 12 that may be a resistor. This resistor 12 has a first terminal 14 coupled to a ground 16 and a second terminal 18 electrically coupled to a pad 20 or node A. Node A 20 is coupled to a pull-up (PU) array 22 and the pull-up array 22 is coupled to a power supply voltage (VDD) 24. The pull-up array 22 has a control input 26.

Node A 20 is also coupled to a drain 28 of transistor or switch 30 labeled M1. The gate 32 of the transistor 30 is coupled to a control 1 signal (ctl1) 34. The control 1 signal 34 is generated by a control block 36 shown in the lower left part of the diagram. The source 38 of the transistor 30 is coupled to a comparator represented schematically as an offset voltage source 40 and an ideal comparator 42. As a result, node A 20 is connected to the positive input 44 of the comparator 42 when the switch 30 is closed. The output 50 of the comparator 42 is coupled through a switch (S1) 52 to a pull-up counter/register 54. The counter/register 54 has a control input 34 and a pull-up output 56. The output 56 is coupled to the control input 26 of the pull-up array 22.

The second calibration impedance (RU) 302 has a first terminal coupled to the supply voltage 24 and a second terminal 62 coupled through node B 64 to a pull-down (PD) array 66. The pull-down array 66 has a second terminal 68 coupled to ground 16. The pull-down array 66 has a control input 70. The node B 64 is coupled through a switch (M4) 72 to the negative input 46 of the comparator 42. The switch 72 is a transistor with its drain 74 coupled to node B 64 and its source 76 coupled to the comparator 42. The gate 78 is coupled to a control 2 (ctl2) signal generated by the control block 36.

The output 50 of the comparator 42 is coupled through a second switch (S2) 80 to a pull-down counter/register 82. The output 84 of the pull-down counter/register 82 is coupled to the control input 70 of the pull-down array 66.

A reference voltage 48 is coupled to a first switch 304 to the positive terminal 44 of the comparator 42. The reference voltage 48 is coupled to a second switch 306 to the negative terminal 46 of the comparator 42. The first switch is controlled by the control 2 signal 78 and the second switch is controlled by the control 1 signal 34. The transistors 304, 306, 30 & 72 form a switching network.

There are two feedback loops in the impedance matching circuit 300. One loop includes of the comparator 42, the first switch (S1) 52, the pull-up counter register 54 and the pull-up array 22. The other loop includes the comparator 42, the second switch 80, the pull-down counter registers 82 and the pull-down array 66.

Initially, the pull-up array loop is enabled while the pull-down array loop is disabled. This means that switch 30 is closed, switch one 52 is closed, switch 306 is closed while switch 72 is open, switch 304 is open and switch two 80 is open. As a result, node A 20 is coupled to the positive input 44 of the comparator 42 and the reference voltage 48 is coupled to the negative input 46 of the comparator 42. The output 50 of the comparator 42 is coupled to the pull-up counter/register 54. Every time the comparator 42 finds a difference in the voltage on its positive input 44 and its negative input 46, the pull-up counter/register 54 is incremented or decremented. This turns off or on fingers in the pull-up array 22 which changes the impedance of the pull-up array 22. This process continues until the impedance of the pull-up array 22 equals the impedance of the calibration impedance (RD) 12. The corresponding n-bit word is stored in the pull-up register 54.

Once the pull-up array bits are stored in the pull-up register 54, the pull-down loop is activated. This means that switch 72 is closed, switch two 80 is closed, switch 304 is closed, while switch 30 is open, switch 306 is open and switch one 52 is open. As a result, node B 64 is coupled to the negative input 46 of the comparator 42 and the reference voltage 48 is coupled to the positive input 44 of the comparator 42. The output 50 of the comparator 42 is coupled to the pull-down counter/register 82. Every time the comparator 42 finds a difference in the voltage on its positive input 44 and its negative input 46, the pull-down counter/register 82 is incremented or decremented. This turns on or off fingers in the pull-down array 66 which changes the impedance of the pull-down array 66. This process continues until the impedance of the pull-down array 66 equals the impedance of the second calibration impedance (RU) 302. The corresponding n-bit word is stored in the pull-down register 82. Note that in one embodiment the reference voltage 48 is one half the supply voltage.

This information of how to set the pull-up array and pull-down array may now be used in an output driver or an input buffer. Since a single comparator 42 is used in the circuit 300 the pull-up array and the pull-down array are within one comparator offset with respect to the external calibration resistor. Also, since the reference voltage is swapped from the negative to the positive terminal for the pull-up impedance and the pull-down impedance calibration loop, the mismatch between pull-up and pull-down array is independent of the comparator offset voltage. In other words, the error in the impedance of the pull-up array and the pull-down array moves in the same direction due to the comparator offset. This reduces timing skew and other problems associated with impedance mismatches.

Figure 8:
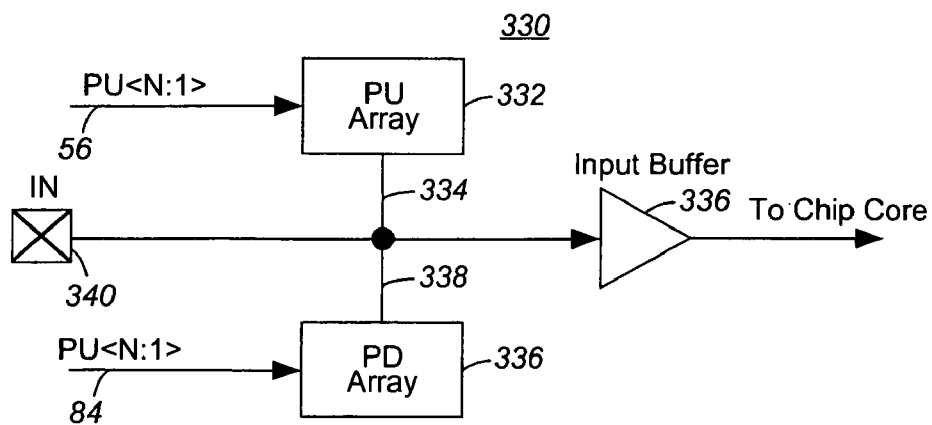
FIG. 8 is a block diagram of an input buffer in accordance with one embodiment of the invention.

FIG. 8 is a block diagram of an input buffer 330 in accordance with one embodiment of the invention. The input buffer 330 has a pull-up array 332 with a control input 56 which is a replica of the pull-up array 22 in FIG. 7. The output 334 is coupled to a standard buffer circuit 336. The input buffer 330 also has a pull-down array 336 with a control input 84 which is a replica of the pull-down array 66 in FIG. 7. The output 338 is coupled to the input pad 340, the output 334 of the pull-up array 332 and the standard input buffer 336.

Note that the there may be a ratio between the impedance of the pull-up array 22 in the impedance matching circuit and the pull-up array 102 or 332 of the output driver or input buffer. For instance, each leg of the pull-up array 102 may have an impedance of /1;5 of the impedance of the same leg in the pull-up array 22. This also applies to the pull-down arrays.

Figure 9:
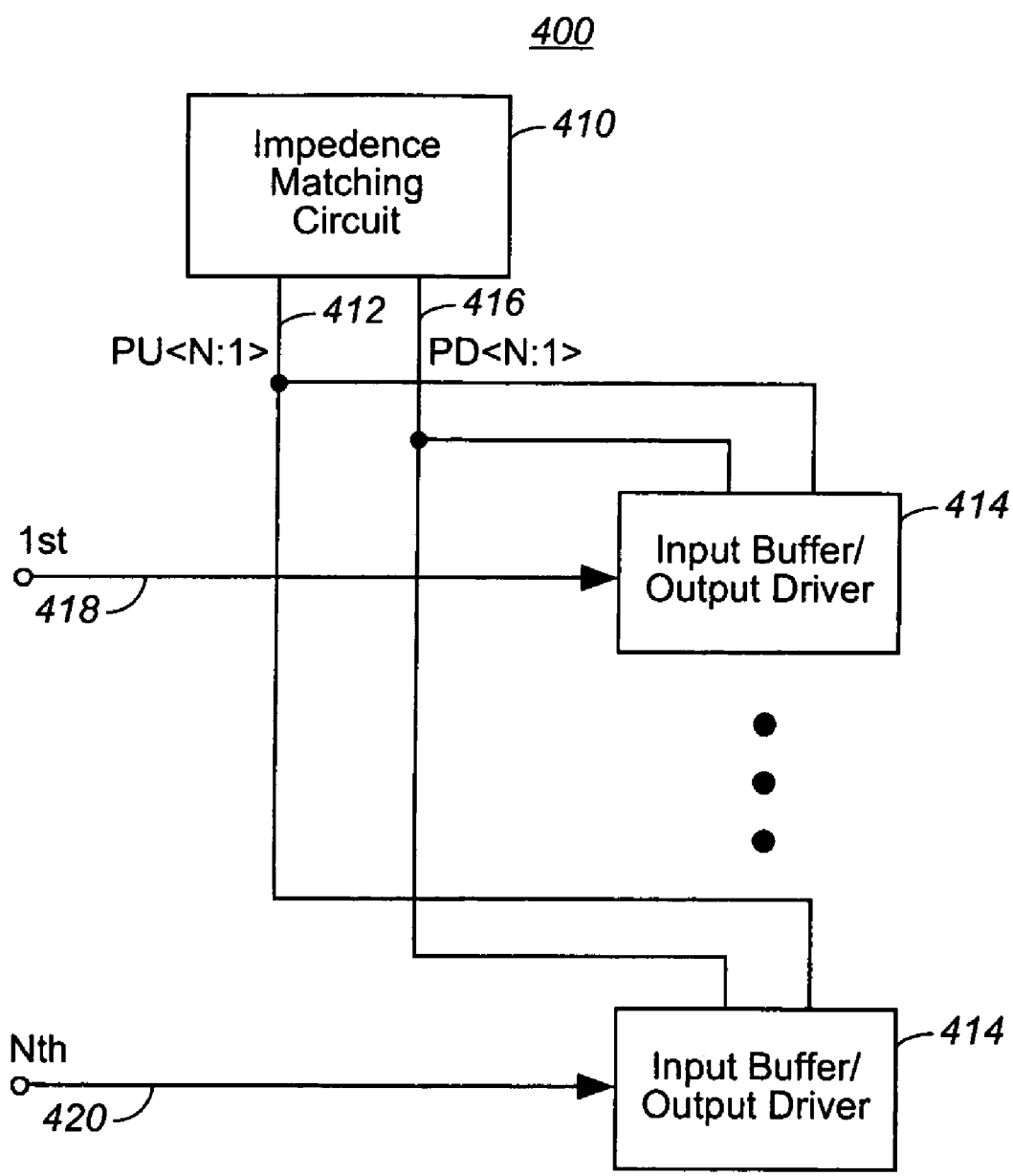
FIG. 9 is a block diagram of a system that uses an impedance matching circuit in accordance with one embodiment of the invention.

FIG. 9 is a block diagram of a system 400 that uses an impedance matching circuit in accordance with one embodiment of the invention. The system has a single impedance matching circuit 410. This impedance matching circuit 410 may use the design shown in FIG. 1 or the design shown in FIG. 7. The output (PU<N:1>) 412 of the pull-up counter/register from the impedance matching circuit 410 is coupled to a plurality of input buffers/output drivers 414. Note that these blocks would commonly be either an input buffer like the one shown in FIG. 8 or an output driver like the one shown in FIG. 2, but not both. A pull-down output (PD<N:1>) 416 from the pull-down counter/register of the impedance matching circuit 410 is also coupled to the plurality of input buffers/output drivers 414. A first input signal 418 is coupled to the top input buffer/output driver 414. The N$^{th}$ input signal 420 is coupled to the bottom input buffer/output driver 414. This shows how a single impedance matching circuit 410 can be used with multiple input buffers or output drivers.

Thus there has been described an impedance matching circuit that decreases the error between the pull-up array and the pull-down array. This reduces any impedance mismatches which may result in timing skews between the data and the clock.

While the invention has been described in conjunction with specific embodiments thereof, it is evident that many alterations, modifications, and variations will be apparent to those skilled in the art in light of the foregoing description. For instance, the logic circuit could be designed with OR gates rather than AND gates and vice versa. This type of alteration would be apparent to those skilled in the art. Accordingly, it is intended to embrace all such alterations, modifications, and variations in the appended claims.

What is claimed is:

1. An impedance matching circuit comprising: a reference impedance; a comparator having a first input coupled to a terminal of the reference impedance having an output and a second input of the comparator coupled to a constant reference voltage; a pull-up counter coupled to an output of the comparator; a pull-up array having a first terminal coupled to a power supply voltage and a second terminal coupled to the terminal of the reference impedance and the first input of the comparator; and a pull-down array having a first terminal coupled to a ground and a second terminal coupled to the first input of the single comparator.

2. The circuit of claim 1, further including a switch between the terminal of the reference impedance and the first input of the comparator.

3. The circuit of claim 1, further including a pull-down counter coupled to the output of the comparator.

4. The circuit of claim 3, further including a switch between the pull-up counter and the output of the comparator.

5. An impedance matching circuit comprising:
a reference impedance having a first terminal coupled to a ground;
a comparator having a first input coupled to a second terminal of the reference impedance and a second input coupled to a constant reference voltage;
a counter/register coupled to an output of the comparator, wherein the counter/register includes a pull-up counter register and a pull-down counter register; and
a first switch between the output of the comparator and the pull-up counter register.

6. The circuit of claim 5, further including an impedance matching array having a control input coupled to an output of the counter/register.

7. The circuit of claim 6, wherein the impedance matching array includes a pull-up array and a pull-down array.

8. The circuit of claim 7, further including a control circuit that selects either the pull-up array or the pull-down array.

9. An impedance matching input buffer comprising:
an impedance matching circuit having a reference impedance and a comparator having a constant reference voltage as an input to the comparator;
a pull-up array coupled to a pull-down array and an input signal, the pull-up array receiving an impedance matching signal from the impedance matching circuit; and
an input buffer having an input coupled to the pull-up array, the pull-down array and the input signal,
wherein the impedance matching circuit has a pull-up counter/register coupled to an output of the comparator and a pull-down counter/register coupled to the output of the comparator.

10. The buffer of claim 9, wherein the impedance matching circuit has a pull-up array in series with the reference impedance and a switching network coupling the comparator to a node between the pull-up array and the reference impedance.

11. The buffer of claim 9, wherein the impedance matching circuit includes a pull-up array and a pull-down array.

12. The buffer of claim 11, wherein the pull-up array of the impedance matching circuit has an impedance that is a predetermined ratio of an impedance of the pull-up array coupled to the input buffer.

13. The buffer of claim 9, wherein the impedance matching circuit has a first reference impedance and a second reference impedance.

* * * * *